(12) United States Patent
Behin-Aein

(10) Patent No.: US 8,698,517 B2
(45) Date of Patent: Apr. 15, 2014

(54) COMPUTING MULTI-MAGNET BASED DEVICES AND METHODS FOR SOLUTION OF OPTIMIZATION PROBLEMS

(75) Inventor: Behtash Behin-Aein, Campbell, CA (US)

(73) Assignee: GlobalFoundries Inc., Grand Cayman (KY)

( * ) Notice: Subject to any disclaimer, the term of this patent is extended or adjusted under 35 U.S.C. 154(b) by 0 days.

(21) Appl. No.: 13/572,988

(22) Filed: Aug. 13, 2012

(65) Prior Publication Data

US 2014/0043061 A1    Feb. 13, 2014

(51) Int. Cl.
*G06F 7/38* (2006.01)
*G06F 17/50* (2006.01)
*H03K 19/173* (2006.01)

(52) U.S. Cl.
USPC .............................. 326/37; 716/126; 977/940

(58) Field of Classification Search
USPC .................... 326/37–41, 47; 977/940
See application file for complete search history.

(56) References Cited

U.S. PATENT DOCUMENTS

| | | | |
|---|---|---|---|
| 2010/0015918 A1* | 1/2010 | Liu et al. ...................... | 455/41.1 |
| 2010/0075599 A1* | 3/2010 | Xi et al. ........................ | 455/41.2 |
| 2010/0091548 A1* | 4/2010 | Reed et al. ................... | 365/148 |
| 2012/0176154 A1* | 7/2012 | Behin-Aein et al. ............ | 326/37 |
| 2013/0100724 A1* | 4/2013 | Venkataraman et al. ..... | 365/145 |

OTHER PUBLICATIONS

S. Kirkpatrick, et al., "Optimization by Simulated Annealing," Science, New Series, vol. 220, No. 4598, pp. 671-680, May 13, 1983.
A. Das., et al., "Quantum Annealing and Analog Quantum Computation," Reviews of Modern Physics (in Press), pp. 1-22, Mar. 24, 2008.
B. Behin-Aein, et al., "Modeling Circuits with Spins and Magnets for All-Spin Logic," IEEE Conference Publications, 2012 Proceedings of the European Solid-State Device Research Conference (ESSDERC), pp. 36-40, Bordeaux, France, Sep. 17-21, 2012.
N. W. Ashcroft, et al., "Solid State Physics," Thomas Learning, Inc, 826 pages, Copy right 1976, ISBN:0-03-083993-9. This textbook can be obtained by purchasing via Amazon.com or other online book stores.
"Spin Wave" from Wikipedia, the Free Encyclopedia, pp. 1-4, http://en.wikipedia.org/wiki/Spin_wave.

* cited by examiner

*Primary Examiner* — Alexander H Taningco
*Assistant Examiner* — Dylan White
(74) *Attorney, Agent, or Firm* — Ditthavong Mori & Steiner, P.C.

(57) ABSTRACT

A computing multi-magnet device and method for solving complex computational problems is provided. Embodiments include a first magnet, a second magnet, and an interconnect between and interconnecting the first and second magnets, the interconnect configured to allow the first and second magnets to communicate via a voltage or current applied to the first and second magnet and conducted by the interconnect. The scalability of computing multi-magnet device provides solutions to algorithms that have exponentially increasing complexity.

21 Claims, 5 Drawing Sheets

COMPUTING MULTI-MAGNET BASED DEVICES AND METHODS FOR SOLUTION OF OPTIMIZATION PROBLEMS

TECHNICAL FIELD

The present disclosure relates to devices that are utilized for solving computational problems. The present disclosure is particularly applicable to solving optimization problems.

BACKGROUND

Transistor based devices used in microprocessors are commonly used to solve computational problems. As computational problems vary in size and complexity, scalability of such devices is a major concern. For example, non-deterministic polynomial complete problems (NP complete problems) are very difficult to solve. Providing solutions to such problems that involves today's technology, involves an exponential growth of computational steps and execution time, as the size and complexity of the problem grows.

Conventional hardware arrangements for providing computational solutions have been implemented with complementary metal-oxide semiconductor (CMOS) technology. Particularly, CMOS technology is used for constructing integrated circuits, such as microprocessors that employ transistors. CMOS systems have only linear improvements in speed and high power requirements. Thus, in handling complex problems, the linear nature of CMOS systems require multi-million core servers, which result in high power usage. To that end, CMOS systems are severely limited in scalability and power efficiency.

A software based computational method, such as the simulated annealing (SA) method, is another known approach to solving complex computational or optimization problems. However, the SA method, like other software based methods, have numerous inefficiencies associated with, for example, translating the software language to the Boolean based computing employed in existing technology. In addition, these software based methods are limited to existing known hardware, such as CMOS technology.

It is generally known that the scaling of transistor based devices used in microprocessors have many limitations, such as power dissipation, OFF state leakage, difficulty in miniaturizing metal interconnects, etc. In like manner, it is generally known that software based methods for providing computational solutions are limited due to their inefficiencies and reliance on hardware that have their own limitations.

A need therefore exists for hardware architecture that has the scalability to provide solutions to algorithms that have exponentially increasing complexity, and a method for implementing such hardware architectures.

SUMMARY

An aspect of the present disclosure is a device for solving computational problems, such as a device having multi-magnets having final relaxed states that are based on magnitude and polarity of a voltage or current applied to the magnets.

Another aspect of the present disclosure is a method of magnetizing magnets of a device and relaxing the magnets to a state that is based on a magnitude and polarity of voltage or current applied to the magnets.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including a first magnet; a second magnet; and an interconnect between and interconnecting the first and second magnets, the interconnect configured to allow the first and second magnets to communicate a voltage or current applied to the first and second magnets and conducted by the interconnect.

In aspects of the present disclosure the first and second magnets are nanomagnets. In further aspects the first and second magnets communicate via spin polarized currents, spin waves, or a domain wall, and the first and second magnets have superposition states that are achievable by magnetizing the first and second magnets, and magnetization of the first and second magnets is applied along respective neutral axes of the first and second magnets by a pulsing agent. In other aspects the pulsing agent is an external magnetic field, a spin transfer torque effect, or a voltage induced rotation of magnetization. Other aspects include the first and second magnets have relaxed states that are achievable after magnetization of the first and second magnets. In further aspects the relaxed states of the first and second magnets are achieved with a known probability and based on a polarity and magnitude of the voltage or current applied to the first and second magnets. In other aspects the relaxed states are ferromagnetic ordering if the voltage or current applied to the first and second magnets has a negative polarity, and the relaxed states are anti-ferromagnetic ordering if the voltage or current applied to the first and second magnets has a positive polarity. In yet further aspects, the communications between the first and second magnets are tunable based on the magnitude and polarity of the voltage or current applied to the first and second magnets.

Another aspect of the present disclosure is a method comprising electrically coupling a first magnet and a second magnet by an interconnect; applying a voltage or current to the first and second magnets and configuring the interconnect to allow the first and second magnets to communicate in response to the voltage or current.

Aspects of the present disclosure include comprising magnetizing the first and second magnets to a superposition state along respective neutral axes of the first and second magnets, and relaxing the first and second magnets to a state that is based on the polarity and magnitude of the voltage or current applied to the first and second magnets. In additional aspects magnetizing the first and second magnets by subjecting the first and second magnets to an external magnetic field, a spin transfer torque, or a voltage induced rotation. In further aspects magnetizing the first and second magnets communicate via spin polarized currents, spin waves, or a domain wall, all of which are generated by the voltage or current applied to the first and second magnets. In other aspects magnetizing the first and second magnets have relaxed states that are achievable with a known probability after magnetization of the first and second magnets.

Additional aspects of the present disclosure include applying a voltage or current having a negative polarity and relaxing the first and second magnets to a ferromagnetic ordering. Yet further aspects of the present disclosure include applying a voltage or current having a positive polarity and relaxing the first and second magnets to an anti-ferromagnetic ordering.

Another aspect of the present disclosure is a method including: arranging a plurality of magnets in a circuit architectural configuration with an interconnect electrically coupling each pair of magnets; for each pair of magnets: applying a voltage or current to the two magnets; and magnetizing the two magnets to a superposition state along respective neutral axes of the two magnets.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of inadequate scalability for computational hardware architecture attendant upon providing solutions to algorithms having exponentially increasing complexity. In accordance with embodiments of the present disclosure, multi-magnet devices having interacting nanomagnets are configured for solving computational algorithms, for example, complex optimization problems. The multi-magnet devices have characteristics which provide natural mapping to the optimization problem of interest. The magnets are capable of achieving final relaxed states that are determined by the magnitudes and polarity of voltages and currents that are applied to the magnets during a magnetization phase. The final relaxed states may be achievable with a known probability. For example, final relaxed states for magnets of various configurations may be predictable to certain degrees of probability, such that the percentage of particular occurrences may be known. In controlling the final relaxed states, the interactions between the magnets are tunable to provide increased scalability in solving complex problems. Therefore, size and power efficiency of the hardware are great improvements over existing hardware, such as transistors and software based methods.

Embodiments of the present disclosure include a device including a first magnet, a second magnet, and an interconnect configured to allow the first and second magnets to communicate via spin polarized currents, spin waves, or a domain wall generated by a voltage or current applied to the first and second magnet and conducted by the interconnect.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
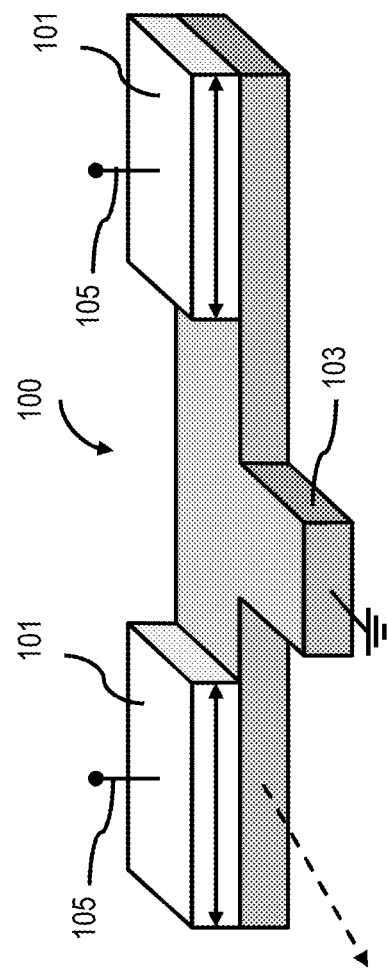
FIGS. 1A and 1B schematically illustrate a multi-magnet device, in accordance with an exemplary embodiment.
Figure 1B:
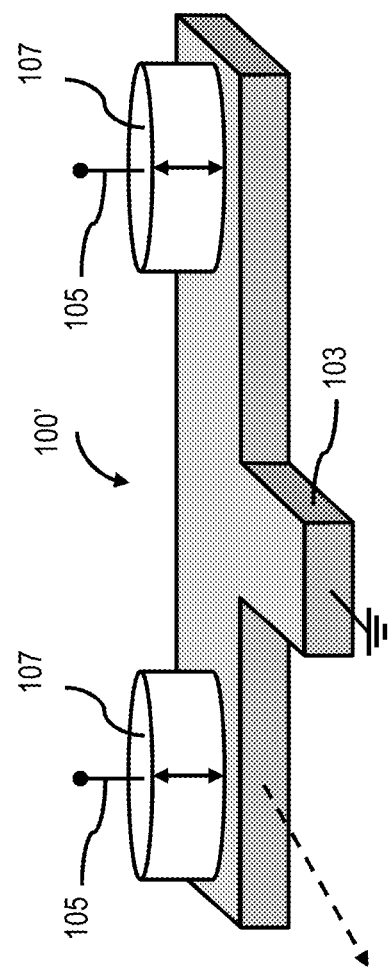

A multi-magnetic device 100 in accordance with an exemplary embodiment of the present disclosure is depicted in FIGS. 1A and 1B. As illustrated in FIG. 1A, the multi-magnetic device includes in-plane magnets 101, an interconnect 103 that electrically couples the magnets 101, and a terminal 105. The interconnect 103 may electrically couple adjacent pairs and non-adjacent pairs of magnets 101. The magnets 101 are capable of communicating and interacting with one another via spin currents, spin waves, or a domain wall generated in the interconnect 103 by voltages or currents. The magnets 101 may be nanomagnets and made of, for example, nickel-iron (NiFe) or cobalt-iron-boron (CoFeB). Adverting to FIG. 1B, a multi-magnet device 100', in accordance with another exemplary embodiment, is depicted having perpendicular magnetic anisotropy (PMA) magnets 107, the interconnect 103, and terminal 105. The magnets 107 may be nanomagnets and made of, for example, CoFeB, iron-platinum (FePt), and cobalt-chromium-platinum (CoCrPt).

The interconnect 103 may be made of, for example, silicon (Si), copper (Cu), aluminum (Al), silver (Ag), Graphene, etc. When the interconnect 103 is formed of Si or Graphene, a tunnel barrier (not shown) may be placed between the magnets 101. The tunnel barrier may have a thickness of 1 to 20 nm and may be formed of magnesium oxide (MgO), aluminum oxide ($Al_2O_3$), or silicon oxide ($SiO_2$).

By applying a voltage or current to the magnets 101 or 107, spin currents, spin waves, or a domain wall are generated in the interconnect 103 and conducted along the interconnect 103, thereby allowing the magnets 101 or 107 to communicate and interact with each other. Each of magnets 101 or 107 is capable of affecting, equally or unequally, the other magnet 101 or 107, respectively, based on spin transfer torque effect. However, the interaction between the magnets 101 or 107 need not be large enough to switch either of the magnets. As discussed in greater detail below, following a magnetization of the magnets 101 or 107, a final relaxed state of the magnets 101 or 107 can be achieved and determined by the magnitude and polarity of the voltages or currents applied to the magnets 101 or 107 during magnetization. The final relaxed state of the magnets 101 and/or 107 may be achievable with a known probability.

Magnets 101 and magnets 107, illustrated in FIG. 1A and FIG. 1B, respectively, can have a thicknesses between 1 and 20 nanometers (nm). In addition, each of magnets 101 and magnets 107 can have a surface area of 100 $nm^2$ to micrometer$^2$ ($\mu^2$). Voltages applied to magnets 101 or magnets 107 can range from 10 millivolts (mV) to 2 volts (V). As the final state of the magnets can be determined by the magnitude and polarity of the currents applied to the magnets 101, currents applied to magnets 101 or magnets 107 can range from 5 micro-amps (μA) to 10 milli-amps (mA).

Figure 2A:
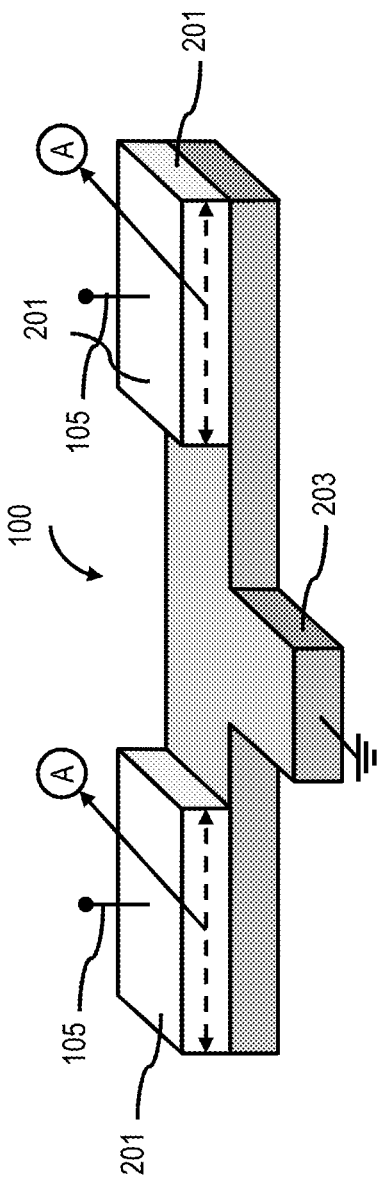
FIGS. 2A and 2B schematically illustrate a multi-magnet device, in accordance with another exemplary embodiment.
Figure 2B:
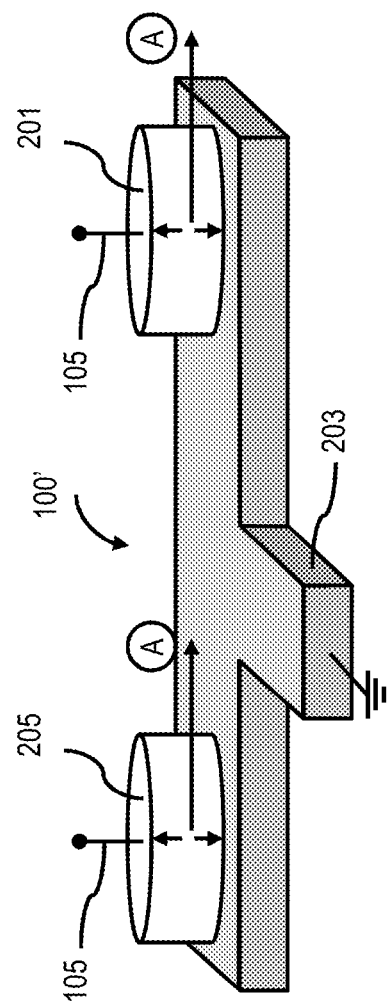

FIGS. 2A and 2B illustrate exemplary embodiments of devices 100 and 100', respectively, having multiple magnets and the directions along which the magnets can be magnetized. Adverting to FIG. 2A, the device 100 includes in-plane magnets 201 and an interconnect 203. A superposition state of the magnets 201 can be achieved by a pulsing agent. For example, the pulsing agent may include an external magnetic field, a spin transfer torque effect, or a voltage induced rotation of magnetization via multi-ferroic materials or strain inducted rotation of magnetization. The magnetization of in-plane magnets 201 is put along a neutral direction, or axis, as indicated by the letter A, for each of the magnets 201.

FIG. 2B depicts the device 100' having magnets 205 and an interconnect 203. Like the in-plane magnets 201, the superposition state of the magnets 205 can be achieved by a pulsed agent, such as an external magnetic field, a spin transfer torque effect, or a voltage induced rotation of magnetization via multi-ferroic materials or strain inducted rotation of magnetization. The magnetization of in-plane magnets 205 is put along a neutral direction A for each of the magnets 205.

To achieve the superposition state of the magnets 201 or PMA magnets 205, the strength of the external magnetic field may be 10 to 10,000 oersteds (Oe). The superposition state of the magnets 201 or PMA magnets 205 is achieved by the spin transfer torque having a current of 5 μA to 10 mA. To achieve the superposition state of the magnets 201 or PMA magnets 205, the voltage induced rotation may have a voltage of 5 mV to 10 V. The external magnetic field, spin transfer torque, and voltage reduced rotation, may all have a pulsing period of 100 picosecond (ps) to 10 millisecond (ms). Following achievement of the superposition state of the magnets 201 or PMA magnets 205 by any of the pulsing methods, the magnets 201 or PMA magnets 205 relax to determined states after a period of 10 ps to 10 ms.

Figure 3A:
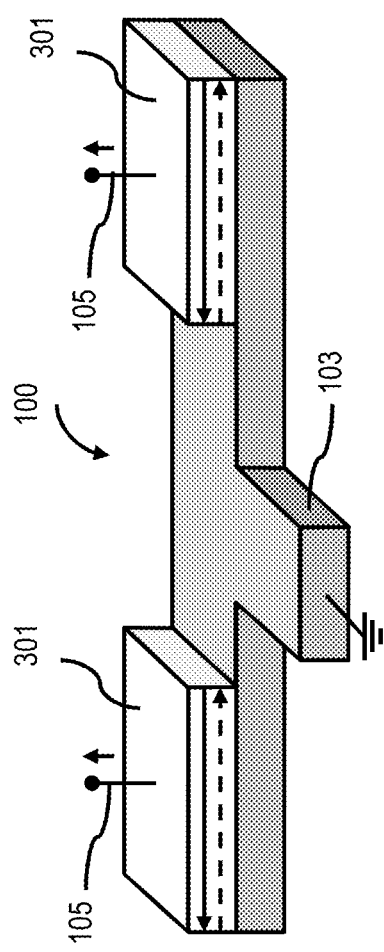
FIGS. 3A through 3D schematically illustrate final relaxed state configurations of a multi-magnet device, in accordance with an exemplary embodiment.
Figure 3B:
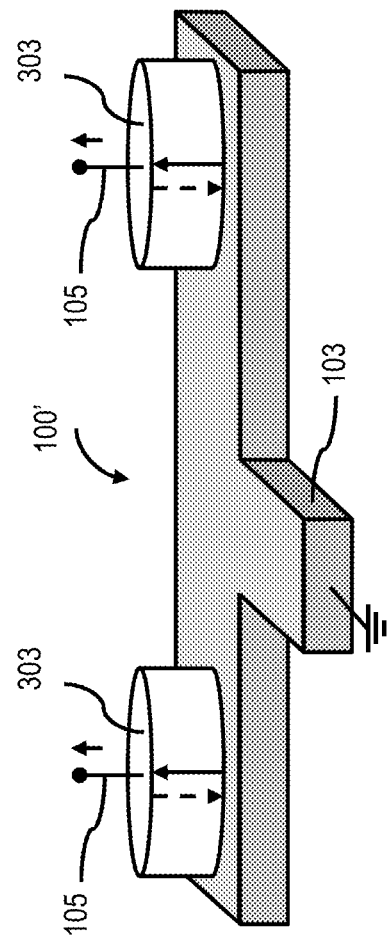

Upon removal of the pulsing agents, the magnetization of magnets 201 or 205 relax to a state determined by the polarity and magnitude of voltages or currents, applied to the magnets 201 or 205. Various relaxed states of the in-plane or PMA magnets can be achieved. The final relaxed state of the magnets 201 and/or 205 may be achievable with a known probability. By controlling the voltage or current applied to the magnets 201 or 205, the device 100 can be tuned and scaled to match the complexity of a computational problem to be solved. That is, the interactions between the magnets 201 or 205 are tunable and thus can be customized for particular applications and problems. FIGS. 3A through 3D illustrate various final (relaxed) states of magnets, in accordance with exemplary embodiments. For negative polarity, the preferred state of the magnets is a ferromagnetic configuration, in which the magnetization of both magnets is parallel to one another, as indicated by the arrows (either solid or dashed) for both magnets pointing in the same directions. Adverting to FIG. 3A, a parallel configuration, having ferromagnetic ordering, of two in-plane magnets 301 is depicted. The final state illustrated in FIG. 3A is achieved by a negative polarity of voltages (V<0) or the direction of currents, as indicated by the small arrows FIG. 3B, depicts a parallel configuration, again indicated by arrows pointing the same directions, having ferromagnetic ordering, of two PMA magnets 303. The final state depicted in FIG. 3B is achieved by a negative polarity of voltages or the direction of currents, as indicated by the small arrows.

Figure 3C:
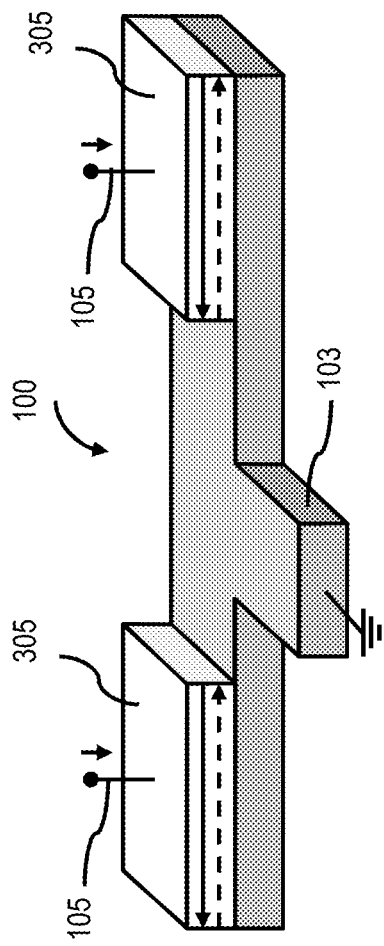
Figure 3D:
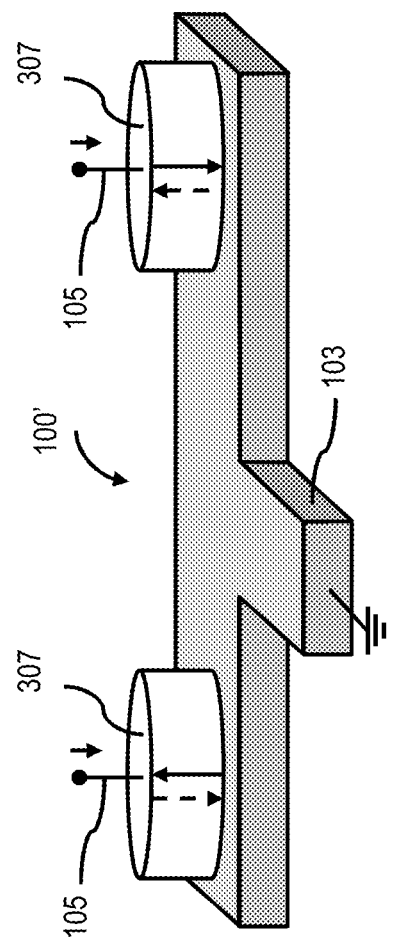

For positive polarity, the preferred state of the magnets is an ant-ferromagnetic configuration, in which the magnetization of the magnets is anti-parallel to one another, as indicated by arrows for the two magnets pointing in opposite directions. Adverting to FIG. 3C, an anti-parallel configuration, having anti-ferromagnetic ordering, of two in-plane magnets 305 is depicted. The final state illustrated in FIG. 3C is achieved by a positive polarity of voltages or the direction of currents, as indicated by the small arrows. FIG. 3D depicts an anti-parallel configuration having anti-ferromagnetic ordering of two PMA magnets 307. The final state shown in FIG. 3D is achieved by a positive polarity of voltages (V>0) or the direction of currents, as indicated by the small arrows.

Figure 4A:
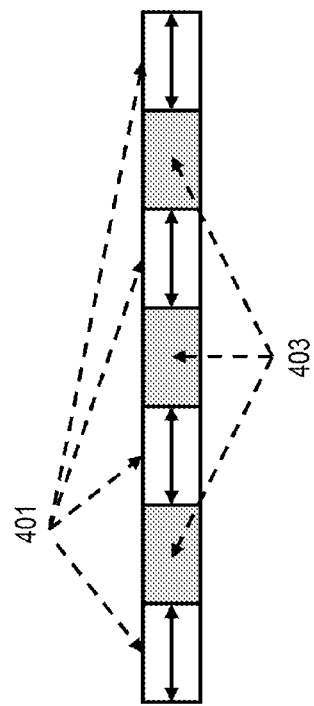
FIGS. 4A through 4C schematically illustrate circuit architectural configurations of a plurality of multi-magnet devices, in accordance with an exemplary embodiment.
Figure 4B:
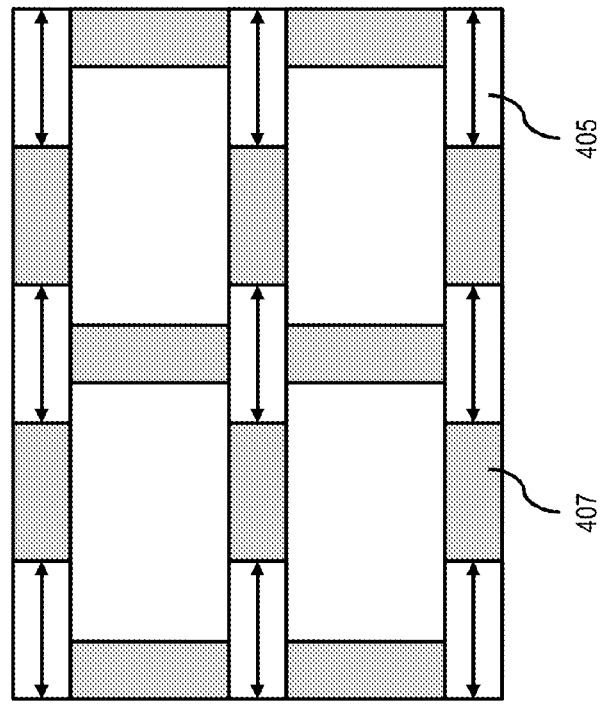
Figure 4C:
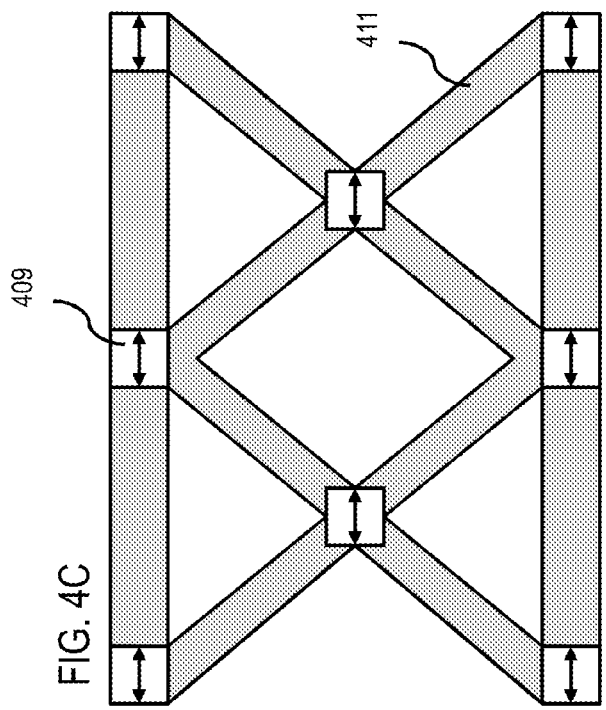

The described magnets, in-plane or PMA, may be formed in a multitude of arrangements. FIGS. 4A to 4C illustrate three examples of different types of magnet arrangements according to exemplary embodiments. The arrangements depicted in FIGS. 4A to 4C can be in-plane or PMA magnets. Adverting to FIG. 4A, magnets 401 and interconnects 403 are formed in an array architecture. FIG. 4B depicts magnets 405 and interconnects 407 arranged in a cross bar architecture. FIG. 4C illustrates magnets 409 and interconnects 411 arranged in a triangular architecture.

Although the description of the devices 100 and 100' has been directed to solving complex optimization problems, the disclosure also applies to devices that augment or replace transistor-based devices and can be used to solve computational problems having any level of complexity. The natural tendencies and characteristics of the devices 100 and 100' allow the devices 100 and 100' to solve computational problems faster and more efficiently than conventional devices, such as transistors based devices. The devices 100 and 100' can be used to complement conventional devices or can be used as a total replacement for conventional devices.

The embodiments of the present disclosure can achieve several technical effects including the scalability to provide solutions to algorithms that have exponentially increasing complexity. The present disclosure enjoys industrial applicability in solving complex optimization problems, such as non-deterministic polynomial complete problems.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a first magnet;
    a second magnet; and
    an interconnect between and interconnecting the first and second magnets, the interconnect configured to allow the first and second magnets to communicate via a voltage or current applied to the first and second magnets and conducted by the interconnect;
    wherein the first and second magnets have superposition states that are achievable by magnetizing the first and second magnets, and wherein magnetization of the first and second magnets is applied along respective neutral axes of the first and second magnets by a pulsing agent having a pulsing period of 100 picosecond (ps) to 10 millisecond (ms).

2. The device according to claim 1, wherein the first and second magnets are nanomagnets.

3. The device according to claim 1, wherein the first and second magnets communicate via spin polarized currents, spin waves, or a domain wall, and the pulsing agent is an external magnetic field, a spin transfer torque effect, or a voltage induced rotation of magnetization.

4. The device according to claim 1, wherein the first and second magnets have relaxed states that are achievable after magnetization of the first and second magnets.

5. The device according to claim 4, wherein the relaxed states of the first and second magnets are achieved with a known probability and based on a polarity and magnitude of the voltage or current applied to the first and second magnets.

6. The device according to claim 4, wherein the relaxed states are ferromagnetic ordering if the voltage or current applied to the first and second magnets has a negative polarity, and the relaxed states are anti-ferromagnetic ordering if the voltage or current applied to the first and second magnets has a positive polarity.

7. The device according to claim 1, wherein communications between the first and second magnets are tunable based on the magnitude and polarity of the voltage or current applied to the first and second magnets.

8. A method comprising:
  electrically coupling a first magnet and a second magnet by an interconnect;
  applying a voltage or current to the first and second magnets; and
  configuring the interconnect to allow the first and second magnets to communicate in response to the voltage or current;
  wherein the first and second magnets are magnetized to a superposition state along respective neutral axes of the first and second magnets by a pulsing agent for a pulsing period of 100 picosecond (ps) to 10 millisecond (ms).

9. The method according to claim 8, further comprising relaxing the first and second magnets to a state that is based on the polarity and magnitude of the voltage or current applied to the first and second magnets.

10. The method according to claim 9, comprising magnetizing the first and second magnets by subjecting the first and second magnets to an external magnetic field, a spin transfer torque, or a voltage induced rotation.

11. The method according to claim 10, wherein the superposition state of the magnets is achieved by the spin transfer torque having a current of 5 $\mu$A to 10 mA.

12. The method according to claim 10, wherein the voltage induced rotation uses a voltage of 5 mV to 10V.

13. The method according to claim 9, wherein the first and second magnets communicate via spin polarized currents, spin waves, or a domain wall, all of which are generated by the voltage or current applied to the first and second magnets.

14. The method according to claim 9, wherein the first and second magnets have relaxed states that are achievable with a known probability after magnetization of the first and second magnets.

15. The method according to claim 9, comprising applying a voltage or current having a negative polarity and relaxing the first and second magnets to a ferromagnetic ordering.

16. The method according to claim 9, comprising applying a voltage or current having a positive polarity and relaxing the first and second magnets to an anti-ferromagnetic ordering.

17. A method comprising:
  arranging a plurality of magnets in a circuit architectural configuration with an interconnect electrically coupling each pair of magnets;
  for each pair of magnets:
    applying a voltage or current to the two magnets; and
    magnetizing the two magnets to a superposition state along respective neutral axes of the two magnets by a pulsing agent for a pulsing period of 100 picosecond (ps) to 10 millisecond (ms).

18. The method according to claim 17, comprising magnetizing each pair of magnets by applying an external magnetic field, a spin transfer torque effect, or a voltage induced rotation of magnetization.

19. The method according to claim 17, further comprising relaxing each pair of magnets to a final state based on the polarity and magnitude of the voltage or current applied to the pair of magnets, the final state for at least one pair of magnets being achievable with a known probability.

20. The method according to claim 19, comprising relaxing each pair of magnets to a final state of a ferromagnetic ordering by applying a voltage or current having a negative polarity.

21. The method according to claim 19, comprising relaxing each pair of magnets to a final state of an anti-ferromagnetic ordering by applying a voltage or current having a positive polarity.

* * * * *